(12) United States Patent
Rogers et al.

(10) Patent No.: US 11,224,138 B2
(45) Date of Patent: Jan. 11, 2022

(54) ELECTRONIC DEVICE COATINGS WITH ULTRAVIOLET LIGHT STABILITY

(71) Applicant: Apple Inc., Cupertino, CA (US)

(72) Inventors: Matthew S. Rogers, San Jose, CA (US); Manish Mittal, San Jose, CA (US); Marta M. Giachino, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 121 days.

(21) Appl. No.: 16/379,272

(22) Filed: Apr. 9, 2019

(65) Prior Publication Data

US 2020/0084903 A1  Mar. 12, 2020

Related U.S. Application Data

(60) Provisional application No. 62/729,887, filed on Sep. 11, 2018.

(51) Int. Cl.
*G02B 5/02* (2006.01)
*H05K 5/03* (2006.01)
*H05K 5/00* (2006.01)

(52) U.S. Cl.
CPC .............. *H05K 5/03* (2013.01); *G02B 5/0242* (2013.01); *H05K 5/0017* (2013.01); *C09K 2323/00* (2020.08); *C09K 2323/05* (2020.08); *C09K 2323/06* (2020.08)

(58) Field of Classification Search
CPC ...... H05K 5/03; H05K 5/0017; Y10T 428/10; Y10T 428/1059; Y10T 428/1086; G02B 5/0242; G02B 5/0236; G02B 5/0294; G02B 6/0025; G02B 6/0051; G02B 1/111; G02B 1/115; C09K 2323/00; C09K 2323/05; C09K 2323/06
USPC ........... 428/1.1, 1.5, 1.6, 328, 329; 349/112, 349/137, 158
See application file for complete search history.

(56) References Cited

U.S. PATENT DOCUMENTS

| | | | |
|---|---|---|---|
| 9,851,823 B2 | 12/2017 | Bauer et al. | |
| 9,921,451 B2 | 3/2018 | Telfer et al. | |
| 10,109,818 B2 | 10/2018 | Park et al. | |
| 10,170,030 B2 | 1/2019 | Perdices-Gonzalez et al. | |
| 10,186,540 B2 | 1/2019 | Rudmann et al. | |

(Continued)

FOREIGN PATENT DOCUMENTS

| | | |
|---|---|---|
| WO | 2014098768 A1 | 6/2014 |
| WO | 2019014013 A1 | 1/2019 |

*Primary Examiner* — Ruiyun Zhang
(74) *Attorney, Agent, or Firm* — Treyz Law Group, P.C.; G. Victor Treyz; David K. Cole

(57) ABSTRACT

An electronic device may be provided with a display and other electrical components. The display may be covered with a display cover layer. A rear housing member, the display cover layer, and other structures in the device may be formed from a transparent member. Transparent members in the device may be covered with layers such as layers of ink. The ink may have a polymer with colorant such as dye or pigment. Light-scattering particles such as inorganic dielectric particles may be incorporated into the polymer. The inorganic dielectric particles may have cores formed from materials such as titanium dioxide and coatings that help prevent discoloration of the titanium dioxide and degradation of surrounding polymer when the inorganic dielectric particles are exposed to ultraviolet light.

19 Claims, 4 Drawing Sheets

(56) References Cited

U.S. PATENT DOCUMENTS

| | | | |
|---|---|---|---|
| 10,270,012 B2 | 4/2019 | Tischler et al. | |
| 2003/0202137 A1* | 10/2003 | Nakamura | G02B 5/3033 |
| | | | 349/96 |
| 2015/0118494 A1 | 4/2015 | Vilner et al. | |
| 2019/0055465 A1 | 2/2019 | Park et al. | |

* cited by examiner

ELECTRONIC DEVICE COATINGS WITH ULTRAVIOLET LIGHT STABILITY

This application claims the benefit of provisional patent application No. 62/729,887, filed Sep. 11, 2018, which is hereby incorporated by reference herein in its entirety.

FIELD

This relates generally to electronic devices and, more particularly, to coatings for structures in electronic devices.

BACKGROUND

Electronic devices often contain displays. A display may have an active area with pixels that display images for a user and an inactive area adjacent to the active area. A layer of glass or other transparent material may serve as a protective display cover layer. The cover layer may overlap the active area and the inactive area. A layer of glass or other transparent material may also form part of a housing for an electronic device.

To hide internal components from view, surfaces in an electronic device such as the inner surface of a transparent layer forming a housing for an electronic device and the inner surface of the protective display cover layer in the inactive area of a display may be covered with a layer of ink. The ink may be formed from a polymer containing colorant (e.g., dye and/or pigment) and light-scattering particles. The light-scattering particles may be formed from an inorganic dielectric such as titanium dioxide. Titanium dioxide has a relatively high refractive index, which helps the light-scattering particles effectively scatter light and thereby provide the ink with a desired appearance.

It can be challenging to provide light-stable ink containing titanium dioxide particles. If care is not taken, exposure of titanium dioxide particles to ultraviolet light may lead to creation of excited electrons that can break down nearby polymer and lead to discoloration of the titanium oxide.

SUMMARY

An electronic device may be provided with a display and other electrical components. The display may be covered with a display cover layer. A rear housing member and other structures in the device may be formed from a transparent housing member.

Structures in the device such as the display cover layer and transparent housing member may be covered with layers such as layers of ink. The ink may have a polymer with colorant such as dye or pigment. In some arrangements, the ink layer may be formed on an inner surface of a transparent layer facing an interior region of the electronic device so that the ink is visible from an exterior region surrounding the electronic device.

Light-scattering particles such as inorganic dielectric particles may be incorporated into the polymer. The inorganic dielectric particles may have cores formed from materials such as titanium dioxide and coatings that help prevent discoloration of the titanium dioxide and degradation of surrounding polymer when the inorganic dielectric particles are exposed to ultraviolet light. The coatings may be formed from inorganic dielectric layers such as layers of silicon oxynitride, silicon nitride, aluminum oxide, and transition metal oxides (e.g., hafnium oxide, zirconium oxide, etc.) with sufficient thicknesses to prevent charge transfer between the titanium diode cores and surrounding polymer.

DETAILED DESCRIPTION

Electronic devices such as cellular telephones and other devices may include transparent members such as display cover layers and transparent housing members. These layers may be formed from materials such as glass, polymer, transparent ceramic, sapphire or other crystalline materials, and/or other transparent materials. The layers may be coated with materials such as ink. The ink may hide internal device components from view.

Ink may include colorant such as dye and/or pigment. The colorant may produce a neutral color (gray, silver, etc.) or a non-neutral color (red, gold, blue, etc.). To provide the ink with opacity and/or a desired external appearance (e.g., a desired white, silver, or bright gray appearance or a desired bright non-neutral color), light-scattering particles may be incorporated into the ink. The light-scattering particles may be, for example, particles of inorganic dielectric materials that have a different index of refraction than the polymer in which the particles are incorporated. As an example, metal oxides with relatively high refractive index values such as titanium dioxide may be used in forming light-scattering particles.

To prevent degradation of the ink and adjacent adhesive layers under exposure to ultraviolet light, the light-scattering particles can be coated with dielectric layers that help prevent charge that is created in the titanium dioxide due to ultraviolet light exposure from reacting with nearby polymer. One or more of these dielectric coatings can be added to the titanium dioxide particles or other suitable light-scattering particles. The materials used for the coating, the number of coatings, and/or the thickness of the coatings can be selected to help to promote ultraviolet light stability. This allows display cover layer coatings, housing member coatings, and other ink-coated structures in electronic devices to exhibit enhanced robustness when exposed to light sources containing ultraviolet wavelengths such as sunlight.

Figure 1:
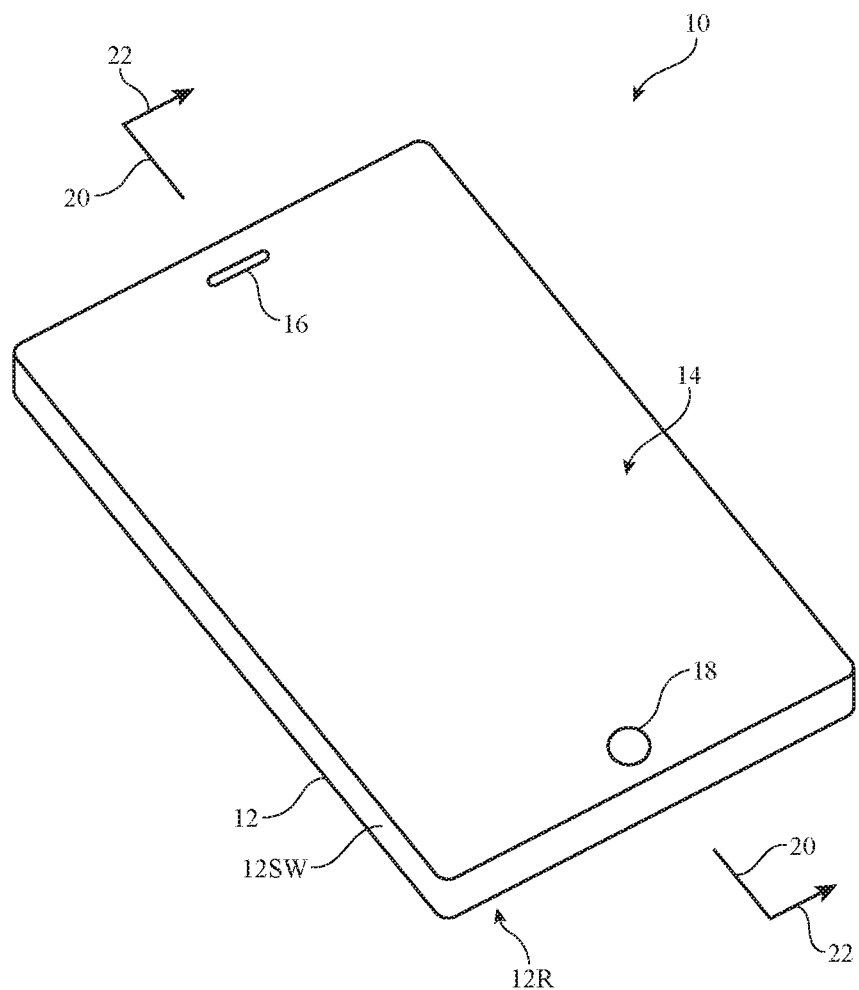
FIG. 1 is a perspective view of an illustrative electronic device in accordance with an embodiment.

An illustrative electronic device of the type that may have one or more structures having ink with coated light-scattering particles is shown in FIG. 1. These structures in device 10 of FIG. 1 may include transparent structures such as transparent structures formed from glass, transparent polymer, transparent ceramic, or sapphire or other transparent crystalline materials (e.g., transparent glass substrates or other transparent substrates that form display cover layers, transparent rear housing walls, other housing structures, portions of camera windows, housing members or other structures with curved surfaces and/or other transparent structures). If desired, other substrates may be coated (e.g., opaque structures, structures formed from materials other than glass, polymer, or crystalline material, etc.). Illustrative configurations in which transparent substrates in device 10 such as display cover layers and transparent housing structures may sometimes be described herein as an example.

Coated transparent substrates may be oriented in device 10 so that the coatings face outwardly or inwardly. For example, coatings may be located on the inner (interior) surfaces of the substrates (the sides of the substrates facing inwardly into the interior of device 10) so that these coatings may be viewed through the substrates from outside the device. In some configurations, such as when a transparent member is used in forming a rear housing wall, a supportive metal plate or other supporting structures may be attached to the inner side of an ink-coated rear housing wall to help strengthen the transparent member.

Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes display 14. Display 14 has been mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, bezel structures, housing sidewall structures, rear housing walls formed from glass plates or other planar transparent members, metal, plastic, and/or other materials, and/or other housing members). Openings may be formed in housing 12 to form communications ports, holes for buttons, and other structures.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures.

Display 14 may have an active area that includes an array of pixels. The array of pixels may be formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies. In some configurations, an inactive border area that is free of pixels may extend along all or part of one or more edges of display 14.

Display 14 may be protected using a display cover layer such as a layer of transparent glass, clear plastic, transparent ceramic, sapphire or other transparent crystalline material, or other transparent layer(s). The display cover layer, which may form a portion of the housing of device 10, may have a planar shape, a convex curved profile, a concave curved profile, a shape with planar and curved portions, a layout that includes a planar main area surrounded on one or more edges with a portion that is bent out of the plane of the planar main area, a planar main area with downwardly curved edges, or other suitable shape. If desired, one or more openings may be formed in the display cover layer to accommodate optional components such as button 16, ports such as speaker port 18, and other structures. In some configurations, display 14 may have an outer layer such as a color filter layer or a thin-film transistor layer in a liquid crystal display that is sufficiently thick and strong to serve as a display cover layer. In other configurations, the outermost layer of display 14 may be a separate cover layer that does not have any color filter elements or thin-film transistor circuitry.

Illustrative device 10 of FIG. 1 has a rectangular footprint (outline when viewed from above) with four peripheral edges. Housing 12 may have sidewalls 12SW that run along the four peripheral edges of device 10. Sidewalls 12SW may be vertical sidewalls, curved sidewalls, integral portions of a rear housing wall that extend fully or partly up the sides of housing 12, and/or other suitable sidewall structures. In some configurations, display 14 has peripheral portions that extend down some or all of the side edges of device 10. Housing 12 may have a rear wall such as rear wall 12R. Rear wall 12R may be formed from integral portions of sidewalls 12SW and/or from separate structures. Rear wall 12R may have a substantially planar surface on a rear face of device 10. Display 14 may include a parallel planar surface on the opposing front face of device 10.

Figure 2:
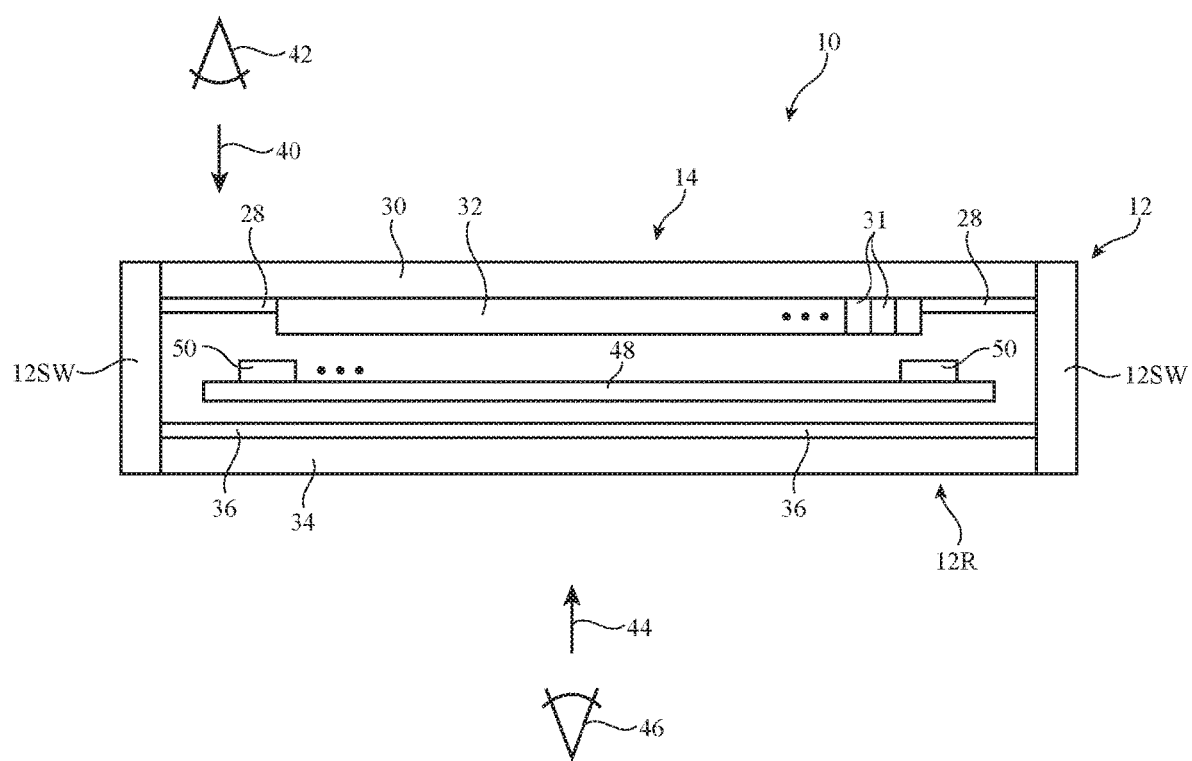
FIG. 2 is a cross-sectional side view of a portion of an illustrative electronic device in accordance with an embodiment.

A cross-sectional side view of device 10 taken along line 20 and viewed in direction 22 of FIG. 1 is shown in FIG. 2. As shown in FIG. 2, device 10 may have an interior in which electrical components 50 are housed. Electrical components 50 may include integrated circuits, sensors, and other circuitry. Components 50 may be mounted on one or more printed circuits such as printed circuit 48.

Display 14 of FIG. 2 may have a transparent layer such as display cover layer 30 (i.e., the outermost layer of display 14). Display cover layer 30 may be formed from a transparent material such as glass, plastic, sapphire or other crystalline material, transparent ceramic, etc. In the active area of display 14, display 14 may contain pixel array structures 32 (e.g., an organic light-emitting diode display layer, a liquid crystal display module, etc.) with an array of pixels 31 for displaying images.

Rear housing wall 12R may be formed from a planar member such as a transparent substrate (e.g., transparent member 34). Member 34 may, for example, be formed from a transparent material such as glass, polymer, or crystalline material such as sapphire. Transparent substrates (e.g., transparent glass substrates) such as display cover layer 30 and/or member 34 may be provided with layers such as ink layers that provide portions of device 10 with a desired external appearance and/or that help hide internal components from view. In the example of FIG. 2, the underside of display cover layer 30 in the inactive area of display 14 has been covered with layer 28 and the inner surface of member 34 (e.g., a transparent rear housing wall or other transparent housing member) has been provided with layer 36. A user such as viewer 42 who is viewing the front face of device 10 in direction 40 may view layer 28 through display cover layer 30. A user such as viewer 46 who is viewing the rear face of device 10 in direction 44 may view layer 36 through member 34. If desired, sidewalls 12SW may be formed from transparent structures (e.g., sidewall members or portions of layer 30 and/or layer 34) and layers such as layers 28 and 36 may be formed on the inner surfaces of these members (as an example).

Layers such as layers 28 and 36 may be formed from dielectric layers (e.g., polymer ink, polymer adhesive, other polymer layers, metal layers, ceramic layers, fiber-composite layers, and/or other layers of material). These layers may include material that is deposited by spraying, printing (e.g., screen printing, inkjet printing, pad printing, etc.), dripping, painting, chemical vapor deposition (e.g., plasma enhanced chemical vapor deposition), physical vapor deposition (e.g., evaporation and/or sputtering), atomic layer deposition, electroplating, lamination, and other deposition techniques. Layers such as layers 28 and 36 may be patterned using shadow mask deposition, printing patterning techniques, photolithography (lift-off, etching, etc.), laser patterning (e.g., ablation), mechanical patterning (e.g., drilling, grinding, milling, etc.) and/or other patterning techniques.

Figure 3:
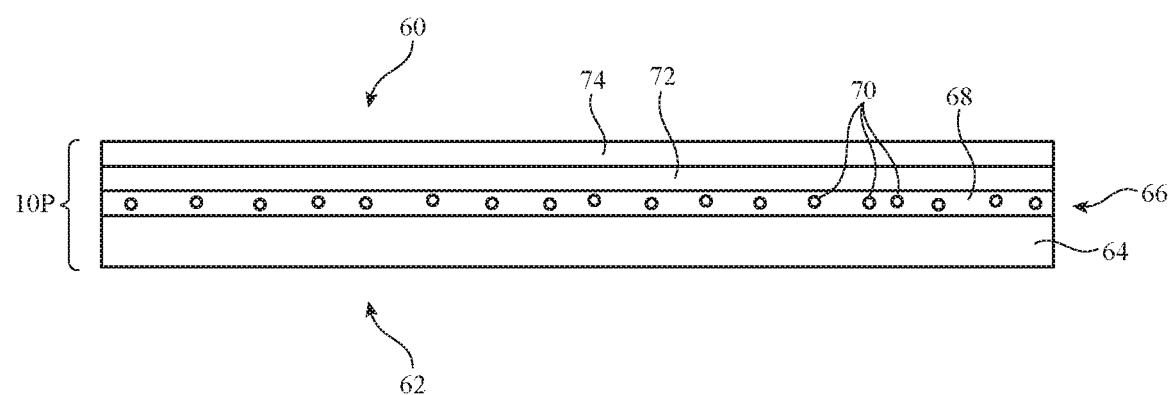
FIG. 3 is a cross-sectional side view of a transparent member and associated layers of material in accordance with an embodiment.

A cross-sectional side view of an illustrative portion 10P of device 10. Portion 10P may be a housing wall such as a rear housing wall or other housing structure in device 10 (e.g., transparent member 34 and layer 36 of FIG. 2), may be a portion of a display cover layer structure (e.g., a portion of display cover layer 30 and layer 28 in an inactive area of display 14 of FIG. 2), and/or may be other portions of device 10P. As shown in FIG. 3, portion 10P may separate interior region 60 of device 10 from exterior region 62, which surrounds device 10. Portion 10P may be formed on the front, side, and/or rear sides of device 10.

As shown in FIG. 3, portion 10P may include a member such as transparent member 64 that serves as a support structure for layers of material such as layer 66. Transparent member 64 may be a layer of glass, polymer, ceramic, crystalline material such as sapphire, and/or other transparent structure. One or more of the surfaces of member 64 may be covered at least partly with layers of material that provide device 10 with a desired appearance. As shown in FIG. 3, for example, the inner surface of member 64 facing interior 60 may be coated with a layer of material such as layer 66.

Layer 66 may include a polymer, other dielectric(s), and/or other material (see, e.g., polymer 68) into which optional colorant such as dye and/or pigment may be incorporated. Polymer 68 may be, for example, polyester, epoxy, polyurethane, or polycarbonate (as examples). The colorant may have a neutral color such as gray, black, or silver or may have a non-neutral color such as red, gold, or blue (as examples).

To provide layer 66 with a desired opacity and brightness when viewed by a viewer (e.g., when viewed through a transparent structure such as transparent member 64 from exterior region 62), light-scattering particles 70 may be incorporated into polymer 68. Light-scattering particles 70 may have a refractive index at visible wavelengths that is sufficiently different than the refractive index of polymer 68 to cause light rays to scatter as they enter layer 66. As an example, light-scattering particles 70 may be formed from inorganic dielectric materials with relatively high refractive index values such metal oxides.

With one illustrative configuration, polymer 68 has a refractive index of 1.5 at a wavelength of 0.5 microns and light-scattering particles 70 are formed from titanium dioxide (titanium dioxide cores) and have a refractive index of 2.7 at this wavelength. As this example demonstrates, the difference in refractive index between particles 70 and polymer 68 may be at about 1.2. If desired, other materials may be used in forming layer 66 (e.g., other materials may be used in forming binder such as polymer 68 and/or light-scattering particles 70), so that this refractive index difference is at least 1.1, less than 1.3, at least 0.5, at least 0.8, at least 1.0, less than 1.4, less than 1.25, 1.0 to 1.3, and/or other suitable value.

In some illustrative arrangements for portion 10P, layer 66 forms a coating layer and may be applied by printing, spraying, dipping, or other coating application techniques. An optional adhesive layer such as adhesive layer 72 and/or other attachment mechanisms may be used to attach layers 64 and 66 to internal device structures. As shown in FIG. 3, for example, adhesive layer 72 may be used to attach internal metal housing member 74 to layer 66 and thereby to transparent member 64. Metal housing member 74 may be, for example, a metal plate (e.g., stamped sheet metal, a metal layer formed using laser cutting or other fabrication techniques, and/or other structural support structures). By laminating member 74 to the inside of transparent member 64 with adhesive layer 72, the overall strength of portion 10P may be enhanced to help prevent breakage of portion 10P during impact events (e.g., during unintended drop events).

Adhesive layer 72 may be formed from a layer of polymer. The polymer of adhesive 72 and/or polymer 68 of layer 66 may degrade in the presence of charge produced in light-scattering particles when ultraviolet light excites electrons in particles 70 (e.g., by promoting electrons above the band gap in particles 70 so that these electrons can react with holes in the adjacent polymer). In addition to breaking down the polymer material, this process may leave electrons in a state in particles 70 that causes particles 70 to discolor (e.g., to become bluish). This can discolor layer 66. In the presence of polymer 68 and/or polymer in adhesive layer 72, possible exposure of particles 70 to oxygen (which might cause the bluish color to fade) is hindered.

These issues of undesired polymer degradation and discoloration of layer 66 can be addressed by providing particles 70 with coatings that help prevent undesired charge transfer between particles 70 and surrounding material such as polymer in layers 66 and 72. The coatings are preferably free of significant pinholes and sufficiently thick to prevent charge transfer when portion 10P is exposed to strong light (e.g., sunlight or other sources that contain ultraviolet light, etc.). Coatings may be applied in solution (e.g., by exposing titanium dioxide core particles to oxides, nitrides, and/or other inorganic materials in solution so that the coatings layers are deposited from a liquid onto the surface of the core particles) and/or may be applied using atomic layer deposition (e.g., by using atomic layer deposition techniques to deposit inorganic dielectric coatings onto the exterior surfaces of core particles in a fluidized bed of core particles). Techniques such as these (e.g., atomic layer deposition) may help reduce or eliminate pinholes in the deposited coatings. Other coating techniques and/or combinations of these techniques may also be used.

Figure 4:
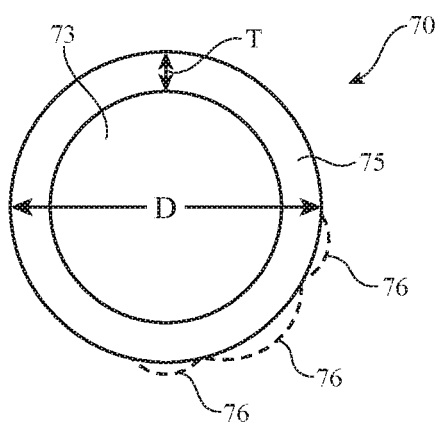
FIGS. 4 and 5 are cross-sectional side views of illustrative light scattering particles in accordance with embodiments.
Figure 5:
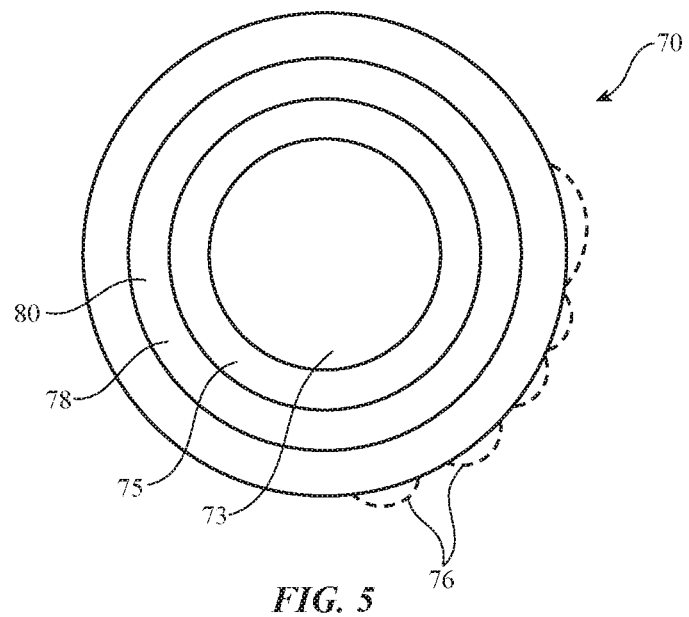

FIGS. 4 and 5 are cross-sectional side views of illustrative coated light-scattering particles. As shown in FIG. 4, light-scattering particles 70 may each have a core 73 surrounded by a coating 75. Core 73 may be formed from titanium dioxide or other suitable light-scattering inorganic dielectric with a refractive index that differs by a desired amount from the refractive index of polymer 68. Core 73 may be provided with a coating such as coating 75. Coating 75 may be formed from a dielectric to help prevent charge transfer from core 73 to adjacent polymer in layers 66 and 68 or other material when particles 70 are embedded in layer 66.

To help prevent charge transfer effectively, the thickness T of coating 75 may be at least 10 nm, at least 15 nm, at least 20 nm, less than 50 nm, or other suitable thickness. Coating 75 may also be formed from a dielectric material that is effective at blocking charge transfer without exhibiting undesired color. As examples, coating 75 may be formed from silicon oxynitride, silicon nitride, aluminum oxide, or a transition metal oxide (e.g., zirconium oxide, hafnium oxide, etc.).

Coating 75 may be characterized by few or no pinholes. For example, in layer 66, fewer than 90% (or other suitable value such as 60%, 80%, 95%, etc.) may have no coating areas less than 5 nm thick (or other suitable threshold value such as 10 nm, 3 nm, etc.). The overall size (diameter D) of particles 70 may be 50-100 nm, at least 35 nm, at least 40 nm, at least 50 nm, at least 60 nm, at least 80 nm, less than 70 nm, less than 80 nm, less than 90 nm, less than 100 nm, less than 120 nm, less than 150 nm, or other suitable value. Use of sufficiently large particle diameters will help ensure satisfactory light scattering and use of sufficiently small particle diameters will prevent particles 70 from creating unsightly visible features in layer 66.

If desired, a thin and potentially discontinuous coating of a material such as aluminum oxide (e.g., a layer with a thickness of at least 2 nm, a few nm, less than 5 nm, less than 10 nm, etc.) may be provided on the outermost surface of particle (see, e.g., optional aluminum oxide coating 76) to help enhance the printability of the polymer material forming layer 66 (e.g., to increase surface energy to lower the water contact angle for particles 70 and thereby allow polymer 68 to evenly coat the surface of layer 64 when polymer 68 is in liquid form before polymer curing). Discontinuous coatings may have areas of different thicknesses and/or pinholes or other openings (e.g., areas where no coating material is present).

As shown in FIG. 5, particle 70 may, if desired, include multiple coating layers (e.g., at least two layers, at least three layers, at least four layers, etc.) on titanium dioxide core 73 to help prevent charge transfer. These layers may include for example, coating 75 on core 73, coating 78 on coating 75, and optional additional coating layer such as coating layer 80 on coating 78 and optional outer coating 76. With an illustrative configuration, coating 75 may be a layer of silicon oxynitride, coating 78 may be a layer of silicon oxide, coating 80 may be a layer of silicon oxynitride, and coating 76 may be a thin (and potentially discontinuous) layer of aluminum oxide to enhance printability. Coatings 75, 78, and 80 may each have a thickness of at least 8 nm, at least 10 nm, at least 12 nm, less than 15 nm, or other suitable thickness value.

Other materials and/or thicknesses may be used for coatings 75, 78, 80, and/or 76 if desired.

The foregoing is merely illustrative and various modifications can be made to the described embodiments. The foregoing embodiments may be implemented individually or in any combination.

What is claimed is:

1. An electronic device having an interior region and surrounded by an exterior region, comprising:
   electrical components in the interior region;
   a transparent structural member between the interior region and the exterior region, wherein the transparent structural member is a material selected from the group consisting of: glass, sapphire, and ceramic;
   a polymer layer on an inner surface of the transparent structural member facing the interior region; and
   light-scattering particles in the polymer layer, wherein each of the light-scattering particles comprises a core of inorganic dielectric and an inorganic dielectric coating having a thickness of at least 10 nm.

2. The electronic device defined in claim 1 wherein the inorganic dielectric of the core comprises titanium dioxide.

3. The electronic device defined in claim 2 wherein the inorganic dielectric coating comprises an inorganic material selected from the group consisting of: silicon oxynitride, silicon nitride, aluminum oxide, and transition metal oxide.

4. The electronic device defined in claim 3 wherein the inorganic dielectric coating comprises an inorganic material selected from the group consisting of: silicon oxynitride, silicon nitride, and transition metal oxide, the electronic device further comprising an aluminum oxide coating on the inorganic dielectric coating.

5. The electronic device defined in claim 4 wherein the aluminum oxide coating has a thickness of less than 5 nm and is discontinuous.

6. The electronic device defined in claim 1 further comprising colorant in the polymer layer.

7. The electronic device defined in claim 1 wherein the transparent structural member is a rear housing wall.

8. The electronic device defined in claim 7 further comprising:
   a metal layer; and
   a layer of adhesive that attaches the metal layer to the polymer layer.

9. The electronic device defined in claim 1 further comprising an array of pixels, wherein the transparent member comprises a display cover layer having a first portion that overlaps the array of pixels and having a second portion and wherein the polymer layer comprises a coating on the inner surface of the display cover layer in the second portion.

10. The electronic device defined in claim 1 wherein the light-scattering particles have diameters of 50 nm to 100 nm.

11. An electronic device having an interior region and surrounded by an exterior region, comprising:
    electrical components in the interior region;
    a transparent member between the interior region and the exterior region;
    a polymer layer on a surface of the transparent member facing the interior region; and
    light-scattering particles in the polymer layer, wherein each of the light-scattering particles comprises a core of inorganic dielectric, a first inorganic dielectric coating on the core, a second inorganic dielectric coating on the first inorganic dielectric coating, a third inorganic dielectric coating on the second inorganic dielectric coating, and a fourth inorganic dielectric coating.

12. The electronic device defined in claim 11 wherein the first, second, and third inorganic dielectric coatings have respective first, second, and third thicknesses that are each at least 5 nm.

13. The electronic device defined in claim 12 wherein the inorganic dielectric of the core comprises titanium dioxide.

14. The electronic device defined in claim 13 wherein the first inorganic dielectric coating comprises silicon oxynitride.

15. The electronic device defined in claim 14 wherein the second inorganic dielectric coating comprises silicon oxide and wherein the third inorganic dielectric coating comprises silicon oxynitride.

16. The electronic device defined in claim 12 wherein the transparent member comprises a glass housing wall and wherein the light-scattering particles have diameters of 50-100 nm.

17. The electronic device defined in claim 11 wherein the fourth inorganic dielectric coating comprises an aluminum oxide coating.

18. An electronic device having an interior region and surrounded by an exterior region, comprising:
- electrical components in the interior region;
- a transparent rear housing wall between the interior region and the exterior region;
- a polymer layer on an inner surface of the transparent rear housing wall facing the interior region;
- a metal layer;
- a layer of adhesive that attaches the metal layer to the polymer layer; and
- light-scattering particles in the polymer layer, wherein each of the light-scattering particles comprises a core of titanium dioxide and an inorganic dielectric coating having a thickness of at least 10 nm.

19. The electronic device defined in claim 18 wherein the inorganic dielectric coating comprises an inorganic material selected from the group consisting of: silicon oxynitride, silicon nitride, aluminum oxide, and transition metal oxide.

\* \* \* \* \*